(12) United States Patent
Im

(10) Patent No.: US 7,906,414 B2
(45) Date of Patent: Mar. 15, 2011

(54) SINGLE-SHOT SEMICONDUCTOR PROCESSING SYSTEM AND METHOD HAVING VARIOUS IRRADIATION PATTERNS

(75) Inventor: James S. Im, New York, NY (US)

(73) Assignee: The Trustees of Columbia University in the City of New York, New YOrk, NY (US)

( * ) Notice: Subject to any disclaimer, the term of this patent is extended or adjusted under 35 U.S.C. 154(b) by 0 days.

(21) Appl. No.: 12/708,307

(22) Filed: Feb. 18, 2010

(65) Prior Publication Data

US 2010/0197147 A1 Aug. 5, 2010

Related U.S. Application Data

(63) Continuation of application No. 10/524,809, filed as application No. PCT/US03/25947 on Aug. 19, 2003, now Pat. No. 7,718,517.

(60) Provisional application No. 60/404,447, filed on Aug. 19, 2002.

(51) Int. Cl.
H01L 21/00 (2006.01)
(52) U.S. Cl. .................. 438/487; 257/E21.134
(58) Field of Classification Search .................. 438/487; 257/E21.134
See application file for complete search history.

(56) References Cited

U.S. PATENT DOCUMENTS

| | | | |
|---|---|---|---|
| 3,632,205 A | 1/1972 | Marcy | |
| 4,234,358 A | 11/1980 | Celler et al. | |
| 4,309,225 A | 1/1982 | Fan et al. | |
| 4,382,658 A | 5/1983 | Shields et al. | |
| 4,456,371 A | 6/1984 | Lin | |
| 4,514,895 A | 5/1985 | Nishimura | |
| 4,639,277 A | 1/1987 | Hawkins | |
| 4,691,983 A | 9/1987 | Kobayashi et al. | |
| 4,727,047 A | 2/1988 | Bozler et al. | |
| 4,758,533 A | 7/1988 | Magee et al. | |
| 4,793,694 A | 12/1988 | Liu | |
| 4,800,179 A | 1/1989 | Mukai | |

(Continued)

FOREIGN PATENT DOCUMENTS

DE 19839718 3/2000

(Continued)

OTHER PUBLICATIONS

U.S. Appl. No. 11/373,772, filed Mar. 9, 2006, Im.

(Continued)

*Primary Examiner* — Fernando L Toledo
(74) *Attorney, Agent, or Firm* — Baker Botts LLP

(57) ABSTRACT

High throughput systems and processes for recrystallizing thin film semiconductors that have been deposited at low temperatures on a substrate are provided. A thin film semiconductor workpiece is irradiated with a laser beam to melt and recrystallize target areas of the surface exposed to the laser beam. The laser beam is shaped into one or more beamlets using patterning masks. The mask patterns have suitable dimensions and orientations to pattern the laser beam radiation so that the areas targeted by the beamlets have dimensions and orientations that are conducive to semiconductor recrystallization. The workpiece is mechanically translated along linear paths relative to the laser beam to process the entire surface of the work piece at high speeds. Position sensitive triggering of a laser can be used generate laser beam pulses to melt and recrystallize semiconductor material at precise locations on the surface of the workpiece while it is translated on a motorized stage.

23 Claims, 5 Drawing Sheets

U.S. PATENT DOCUMENTS

| | | |
|---|---|---|
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,976,809 A | 12/1990 | Broadbent |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,413,958 A | 5/1995 | Imahashi et al. |
| 5,417,897 A | 5/1995 | Asakawa et al. |
| 5,436,095 A | 7/1995 | Mizuno et al. |
| 5,453,594 A | 9/1995 | Konecny |
| 5,456,763 A | 10/1995 | Kaschmitter et al. |
| 5,466,908 A | 11/1995 | Hosoya et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,591,668 A | 1/1997 | Maegawa et al. |
| 5,614,421 A | 3/1997 | Yang |
| 5,614,426 A | 3/1997 | Funada et al. |
| 5,616,506 A | 4/1997 | Takemura |
| 5,620,910 A | 4/1997 | Teramoto |
| 5,710,050 A | 1/1998 | Makita et al. |
| 5,721,606 A | 2/1998 | Jain |
| 5,736,709 A | 4/1998 | Neiheisel |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka |
| 5,948,291 A | 9/1999 | Neylan et al. |
| 5,960,323 A | 9/1999 | Wakita |
| 5,986,807 A | 11/1999 | Fork |
| 6,014,944 A | 1/2000 | Russell et al. |
| 6,020,224 A | 2/2000 | Shimogaichi et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,093,934 A | 7/2000 | Yamazaki et al. |
| 6,117,301 A | 9/2000 | Freudenberger et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,176,922 B1 | 1/2001 | Aklufi et al. |
| 6,177,301 B1 | 1/2001 | Jung |
| 6,184,490 B1 | 2/2001 | Schweizer |
| 6,187,088 B1 | 2/2001 | Okumura |
| 6,190,985 B1 | 2/2001 | Buynoski |
| 6,193,796 B1 | 2/2001 | Yang |
| 6,235,614 B1 | 2/2001 | Yang |
| 6,198,141 B1 | 3/2001 | Yamazaki et al. |
| 6,203,952 B1 | 3/2001 | O'Brien et al. |
| 6,222,195 B1 | 4/2001 | Yamada et al. |
| 6,242,291 B1 | 6/2001 | Kusumoto et al. |
| 6,255,146 B1 | 7/2001 | Shimizu et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,186 B1 | 12/2001 | Park et al. |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,473 B1 | 2/2003 | Jung |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,449 B1 | 4/2003 | Im et al. |
| 6,562,701 B2 | 5/2003 | Ishida et al. |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,660,575 B1 | 12/2003 | Zhang |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,750,424 B2 | 6/2004 | Tanaka |
| 6,755,909 B2 | 6/2004 | Jung |
| 6,767,804 B2 | 7/2004 | Crowder |
| 6,770,545 B2 | 8/2004 | Yang |
| 6,784,455 B2 | 8/2004 | Maekawa et al. |
| 6,830,993 B1 | 12/2004 | Im et al. |
| 6,858,477 B2 | 2/2005 | Deane et al. |
| 6,916,690 B2 | 7/2005 | Chang |
| 6,962,860 B2 | 11/2005 | Yamazaki et al. |
| 7,049,184 B2 | 5/2006 | Tanabe |
| 7,078,281 B2 | 7/2006 | Tanaka et al. |
| 7,091,411 B2 | 8/2006 | Falk et al. |
| 7,144,793 B2 | 12/2006 | Gosain et al. |
| 7,164,152 B2 | 1/2007 | Im |
| 7,187,016 B2 | 3/2007 | Arima |

| | | |
|---|---|---|
| 7,217,605 B2 | 5/2007 | Kawasaki et al. |
| 7,259,081 B2 | 8/2007 | Im |
| 7,297,982 B2 | 11/2007 | Suzuki et al. |
| 7,300,858 B2 | 11/2007 | Im |
| 7,311,778 B2 | 12/2007 | Im et al. |
| 7,318,866 B2 | 1/2008 | Im |
| 7,319,056 B2 | 1/2008 | Im et al. |
| 7,326,876 B2 | 2/2008 | Jung |
| 7,341,928 B2 | 3/2008 | Im |
| 7,645,337 B2 | 1/2010 | Im |
| 2001/0001745 A1* | 5/2001 | Im et al. ............. 438/747 |
| 2001/0041426 A1* | 11/2001 | Im ................... 438/479 |
| 2002/0083557 A1 | 7/2002 | Jung |
| 2002/0104750 A1* | 8/2002 | Ito ............... 204/157.15 |
| 2002/0119609 A1 | 8/2002 | Hatano et al. |
| 2002/0151115 A1 | 10/2002 | Nakajima et al. |
| 2003/0000455 A1* | 1/2003 | Voutsas ............. 117/47 |
| 2003/0003242 A1 | 1/2003 | Voutsas |
| 2003/0006221 A1 | 1/2003 | Hong et al. |
| 2003/0013278 A1 | 1/2003 | Jang et al. |
| 2003/0014337 A1 | 1/2003 | Mathews et al. |
| 2003/0029212 A1 | 2/2003 | Im |
| 2003/0057418 A1 | 3/2003 | Asano |
| 2003/0068836 A1 | 4/2003 | Hongo et al. |
| 2003/0089907 A1* | 5/2003 | Yamaguchi et al. ...... 257/57 |
| 2003/0096489 A1 | 5/2003 | Im et al. |
| 2003/0119286 A1* | 6/2003 | Im et al. ............. 438/487 |
| 2003/0148565 A1 | 8/2003 | Yamanaka |
| 2003/0194613 A1 | 10/2003 | Voutsas et al. |
| 2003/0196589 A1 | 10/2003 | Mitani et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0032249 A1 | 2/2005 | Im et al. |
| 2005/0034653 A1* | 2/2005 | Im et al. ............. 117/84 |
| 2005/0059224 A1 | 3/2005 | Im |
| 2005/0059265 A1 | 3/2005 | Im |
| 2005/0112906 A1 | 5/2005 | Maekawa et al. |
| 2005/0141580 A1 | 6/2005 | Partlo et al. |
| 2005/0142450 A1 | 6/2005 | Jung |
| 2005/0142451 A1 | 6/2005 | You |
| 2005/0235903 A1 | 10/2005 | Im |
| 2005/0236908 A1 | 10/2005 | Rivin |
| 2006/0030164 A1 | 2/2006 | Im |
| 2006/0035478 A1 | 2/2006 | You |
| 2006/0102901 A1 | 5/2006 | Im et al. |
| 2006/0125741 A1 | 6/2006 | Tanaka et al. |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im |
| 2007/0020942 A1 | 1/2007 | Im |
| 2007/0032096 A1 | 2/2007 | Im |
| 2007/0108472 A1 | 5/2007 | Jeong et al. |
| 2007/0111349 A1 | 5/2007 | Im |
| 2007/0184638 A1 | 8/2007 | Kang et al. |
| 2007/0215942 A1 | 9/2007 | Chen et al. |
| 2008/0035863 A1 | 2/2008 | Im et al. |
| 2008/0124526 A1 | 5/2008 | Im |
| 2008/0176414 A1 | 7/2008 | Im |
| 2009/0001523 A1 | 1/2009 | Im |
| 2009/0045181 A1 | 2/2009 | Im |
| 2009/0137105 A1 | 5/2009 | Im |
| 2009/0173948 A1 | 7/2009 | Im et al. |
| 2009/0189164 A1 | 7/2009 | Im et al. |
| 2009/0218577 A1 | 9/2009 | Im |
| 2009/0242805 A1 | 10/2009 | Im |
| 2009/0309104 A1 | 12/2009 | Im |
| 2010/0032586 A1 | 2/2010 | Im et al. |
| 2010/0065853 A1 | 3/2010 | Im |
| 2010/0099273 A1 | 4/2010 | Im |

FOREIGN PATENT DOCUMENTS

| | | |
|---|---|---|
| DE | 10103670 | 8/2002 |
| EP | 681316 | 8/1995 |
| EP | 1067593 | 10/2001 |
| JP | S57-027035 | 2/1982 |
| JP | S62-160781 | 7/1987 |
| JP | S62-181419 | 8/1987 |
| JP | S62-216320 | 9/1987 |
| JP | H01-256114 | 10/1989 |
| JP | H02-081422 | 3/1990 |
| JP | H02-283036 | 11/1990 |
| JP | H04-033327 | 2/1992 |
| JP | H04-167419 | 6/1992 |
| JP | H04-279064 | 10/1992 |
| JP | H04-282869 | 10/1992 |
| JP | H05-048190 | 2/1993 |
| JP | H06-252048 | 9/1994 |
| JP | H06-283422 | 10/1994 |
| JP | H07-176757 | 7/1995 |
| JP | H08-078330 | 3/1996 |
| JP | H09-007968 | 1/1997 |
| JP | H10-244390 | 9/1998 |
| JP | H11-281997 | 10/1999 |
| JP | H11-297852 | 10/1999 |
| JP | 2000-223425 | 8/2000 |
| JP | 2000-346618 | 12/2000 |
| JP | 2001-023920 | 1/2001 |
| JP | 2003-100653 | 4/2003 |
| JP | 2004-031809 | 1/2004 |
| KR | 2000-0053428 | 8/2000 |
| TW | 464960 | 11/2001 |
| WO | WO 98/24118 | 6/1998 |
| WO | WO 99/31719 | 6/1999 |
| WO | WO 00/14784 | 3/2000 |
| WO | WO 02/086955 | 10/2002 |
| WO | WO 03/046965 | 6/2003 |
| WO | WO 03/084688 | 10/2003 |
| WO | WO 2004/017380 | 2/2004 |

OTHER PUBLICATIONS

U.S. Appl. No. 11/373,772, filed Oct. 26, 2009, Non-Final Rejection.

U.S. Appl. No. 11/373,772, filed Oct. 26, 2009, Response to Non-Final Rejection.

U.S. Appl. No. 11/373,772, filed Feb. 24, 2010, Final Rejection.

U.S. Appl. No. 11/373,772, filed May 20, 2010, Response to Final Rejection.

U.S. Appl. No. 11/373,772, filed Jun. 11, 2010, Advisory Action.

U.S. Appl. No. 11/373,772, filed Aug. 24, 2010, Request for Continued Examination.

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).

Crowder et al., "Low-Temperature Single-Crystal Si TFT's Fabricated on Si Films processed via Sequential Lateral Solidification", IEEE Electron Device Letter, vol. 19 (8), p. 306 (1998).

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.

C. E. Nebel, "Laser Interference Structuring of A-Si:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).
"Overview of Beam Delivery Systems for Excimer Lasers," Micro/Las Lasersystem GmbH. 1999.
K.H. Weiner et al., "Ultrashallow Junction Formation Using Projection Gas Immersion Laser Doping (PGILD)," A Verdant Technologies Technical Brief, Aug. 20, 1997.
Hau-Riege C.S. et al., "The Effects Microstructural Transitions at Width Transitions on interconnect reliabity," Journal of Applied Physics, Jun. 15, 2000, vol. 87, No. 12, pp. 8467-8472.
McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, vol. 43, No. 10, Nov. 1983, pp. 946-948.
Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 6768, pp. 175-180.
Broadbent et al., "Excimer Laser Processing of A1-1%Cu/TiW Interconnect Layers," 1989 Proceedings, Sixth International IEEE VLSI Multilevel Interconnection COnference, Santa Clara, CA, Jun. 12-13, 1989, pp. 336-345.
H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.
S.D. Brotherton, "Polycrystalline Silicon Thin Film Transistors," 10 Semicond. Sci. Tech., pp. 721-738 (1995).
H. Watanabe et al., "Crystallization Process of Polycrystalline Silicon by KrF Excimer Laser Annealing," 33 Japanese J. Of Applied Physics Part 1—Regular Papers Short Notes & Review Papers, pp. 4491-4498 (1994).
E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).
Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).
Im et al., "Phase Transformation Mechanisms Involved in Excimer Laser Crystallization of Amorphous Silicon Films," Appl. Phys. Lett., vol. 63 (14), p. 1969 (1993).
Im et al., "On the Super Lateral Growth Phenomenon Observed in Excimer Laser-Induced Crystallization of Thin Si Films," Appl. Phys. Lett., vol. 64 (17), p. 2303 (1994).
Brochure from MicroLas Lasersystem, GmbH, "UV Optics Systems for Excimer Laser Based Micromaching and Marking". 1999.
Ishida et al., "Ultra-shallow boxlike profiles fabricated by pulsed ultraviolet-laser doping process", J. Vac. Sci. Technol. B 12(1), p. 399-403, 1994.
Yoshimoto, et al., "Excimer-Laser-Produced and Two-Dimensionally Position-Controlled Giant Si Grains on Organic SOG Underlayer", p. 285-286, AM-LCD 2000.
Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, pp. 5700-5705, (1999).
I.W. Boyd, Laser Processing of Thin Films and Microstructures, Oxidation, Deposition, and Etching of Insulators (Springer—Verlag Berlin Heidelber 1987).
N. Yamamuchi and R. Reif, Journal of Applied Physics, "Polycrystalline silicon thin films processed with silicon ion implantation and subsequent solid-phase crystallization: Theory, experiments, and thin-film transistor applications"—Apr. 1, 1994—vol. 75, Issue 7, pp. 3235-3257.
T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.
Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.
Bergmann, R. et al., Nucleation and Growth of Crystalline Silicon Films on Glass for Solar Cells, Phys. Stat. Sol., 1998, pp. 587-602, vol. 166, Germany.
Biegelsen, D.K., L.E. Fennell and J.C. Zesch, Origin of oriented crystal growth of radiantly melted silicon on SiO/sub 2, Appl. Phys. Lett. 45, 546 (1984).
Boyd, Laser Processing of Thin Films and Microstructures, Oxidation, Deposition, and Etching of Insulators (Springer—Verlag Berlin Heidelber 1987).
Brotherton, S.D., et al., Characterisation of poly-Si TFTs in Directionally Solidified SLS Si, Asia Display/IDS'01, p. 387-390. (2001).
Crowder et al., "Parametric investigation of SLS-processed polysilicon thin films for TFT application," Preparations and Characterization, Elsevier, Sequoia, NL, vol. 427, No. 1-2, Mar. 3, 2003, pp. 101-107, XP004417451.
Crowder et al., "Sequential Lateral Solidification of PECVD and Sputter Deposited a-Si Films", Mat. Res. Soc. Symp. Proc. 621:Q.9.7.1-9.7.6, 2000.
Dassow, R. et al. Laser-Crystallized Polycrystalline Silicon on Glass for Photovoltaic Applications, Solid State Phenomena, pp. 193-198, vols. 67-68, Scitec Publications, Switzerland, (1999).
Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.
Dassow, R. et al., Laser crystallization of silicon for high-performance thin-film transistors, Semicond. Sci. Technol., 2000, pp. L31-L34, vol. 15, UK.
Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).
Geis et al., "Crystallographic orientation of silicon on an amorphous substrate using an artificial surface-relief grating and laser crystallization," Appl. Phys. Lett. 35(1) Jul. 1, 1979, 71-74.
Geis et al., "Silicon graphoepitaxy using a strip-heater oven," Appl. Phys. Lett. 37(5), Sep. 1, 1980, 454-456.
Geis et al., "Zone-Melting recrystallization of SI Films with a moveable-strip heater oven" J. Electro-Chem. Soc., 129: 2812 (1982).
Gupta et al., "Numerical Analysis of Excimer-laser induced melting and solidification of Si Thin Films", Applied Phys. Lett., 71:99, 1997.
Hau-Reige et al., "Microstructural Evolution Induced by Scanned Laser Annealing in Al Interconnects," Appl. Phys. Lett., vol. 75, No. 10, p. 1464-1466, 1999.
Hawkins, W.G. et al., "Origin of lamellae in radiatively melted silicon films," appl. Phys. Lett. 42(4), Feb. 15, 1983.
Hayzelden, C. and J.L. Batstone, Silicide formation and silicide-mediated crystallization of nickel-implanted amorphous silicon thin films, J. Appl. Phys. 73, 8279 (1993).
Im, J.S., Method and system for producing crystalline thin films with a uniform crystalline orientation, U.S. Appl. No. 60/503,419; ref. file # 36013(BB); Columbia ref. M02-063, (Sep. 16, 2003).
Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.
Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.
Kahlert, H., "Creating Crystals", OE Magazine, Nov. 2001, 33-35.
Kim, C. et al., Development of SLS-Based SOG Display, IDMC 2005, Thu-15-02, 252-255.
Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.J. et al., "New Excimer-laser-crystallization method for producing large-grained and grain boundary-location-controlled Si Films for Thin Film Transistors", Applied Phys. Lett., 68: 1513, (1996).

Kim, H.J. et al., "Multiple Pulse Irradiation Effects in Excimer Laser-Induced Crystallization of Amorphous Si Films," Mat. Res. Soc. Sym. Proc., 321:665-670 (1994).

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3 , 2005, (2000).

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. And S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on, (2000).

Mariucci et al., "Advanced excimer laser crystallization techniques," Thin Solid Films, vol. 338, pp. 39-44, 2001.

Micro/Las Lasersystem, GmbH, "UV Optics Systems for Excimer Laser Based Micromaching and Marking" (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Sato et al., "Mobility anisotropy of electrons in inversion layers on oxidized silicon surfaces" Physical Review B (State State) 4, 1950 (1971).

Smith, H.I. et al., "The Mechanism of Orientation in Si Graphoepitaxy by Laser or Strip Heater Recrystallization," J. Electrochem. Soc.: Solid-State Science and Technology, Taiwan FPD, Jun. 11, 2005, pp. 1-12.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Thompson, C.V. and H.I. Smith, Surface-energy-driven secondary grain growth in ultrathin (<100 nm) films of silicon, Appl. Phys. Lett. 44, 603 (1984).

van der Wilt, "The Commercialization of the SLS Technology," Taiwan FPD, Jun. 11, 2004, pp. 1-12.

Van Der Wilt, P.C., "State-of-the-Art Laser Crystallization of Si for Flat Panel Displays," PhAST, May 18, 2004, pp. 1-34.

Van Der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Weiner, K. H. et al. "Laser-assisted, Self-aligned Silicide Formation," A Verdant Technologies technical brief, Aug. 7, 1997, 1-9.

Werner, J.H., et al. From polycrystalline to single crystalline silicon on glass, Thin Solid Films 383, 95-100, 2001.

White et al., "Characterization of thin-oxide MNOS memory transistors" IEEE Trans. Electron Devices ED-19, 1280 (1972).

Gosain et al., "Formation of (100)-Textured Si Film Using an Excimer Laser on a Glass Substrate," Jpn. J. Appl. Phys., vol. 42 (2003) pp. L135-L137.

Jeon et al., "New Excimer Laser Recrystallization of Poly-Si for Effective Grain Growth and Grain Boundary Arrangement," Jpn. J. Appl. Phys. vol. 39 (Apr. 2000) pp. 2010-2014.

* cited by examiner

SINGLE-SHOT SEMICONDUCTOR PROCESSING SYSTEM AND METHOD HAVING VARIOUS IRRADIATION PATTERNS

CROSS-REFERENCE TO RELATED APPLICATION

This application is a continuation of U.S. patent application Ser. No. 10/524,809, filed on Feb. 15, 2005 now U.S. Pat. No. 7,718,517, which is a national phase of International Patent Application No. PCT/US03/25947, filed Aug. 19, 2003, published on Feb. 26, 2004 as International Patent Publication No. WO 04/017381, which claims priority from U.S. Application No. 60/404,447, which was filed on Aug. 19, 2002, each of which are incorporated by reference in their entireties herein, and from which priority is claimed.

BACKGROUND OF THE INVENTION

The present invention relates to semiconductor processing methods, and more particularly, to methods for making semiconductors materials in a form suitable for fabrication of thin-film transistor ("TFT") devices.

Flat panel displays and other display units are used as visual imaging interfaces for the common and ubiquitous electronic devices and appliances such as computers, image sensors, and television sets. The displays are fabricated, for example, from thin films of liquid crystal and semiconductor material placed on glass or plastic substrates. Each display is composed of a grid (or matrix) of picture elements ("pixels") in the liquid crystal layer. Thousands or millions of these pixels together create an image on the display. TFT devices fabricated in the semiconductor material layer are used as switches to individually turn each pixel "on" (light) or "off" (dark). The semiconductor materials used for making the TFTs, traditionally, are amorphous or polycrystalline silicon thin films. These films are deposited on to the substrates by physical or chemical processes at relatively low deposition temperatures in consideration of the low melting temperatures of the substrate materials used (e.g., glass or plastic). The relatively low deposition temperatures degrade the crystallinity of the deposited silicon films and cause them to be amorphous or polycrystalline.

Unfortunately, the device characteristics of a TFT fabricated in a silicon thin film undesirably degrade generally in proportion to the non-crystallinity of the silicon thin film. For industrial TFT device applications, silicon thin films of good crystalline quality are desirable. The crystallinity of a thin film of silicon deposited at low temperatures on a substrate may be advantageously improved by laser annealing. Maegawa et al. U.S. Pat. No. 5,766,989, for example, describes the use of excimer laser annealing ("ELA") to process amorphous silicon thin films deposited at low temperatures into polycrystalline silicon thin films for LCD applications. The conventional ELA processes, however, are not entirely satisfactory at least in part because the grain sizes in the annealed films are not sufficiently uniform for industrial use. The non-uniformity of grain size in the annealed films is related to the beam shape of the laser beam, which is used in the ELA process to scan the thin film.

Im et al. U.S. Pat. No. 6,573,531 and Im U.S. Pat. No. 6,322,625 (hereinafter "the '531 patent" and "the '625 patent", respectively), both of which are incorporated by reference herein in their entireties, describe laser annealing apparatus and improved processes for making large grained polycrystalline or single crystal silicon structures. The laser annealing processes described in these patents involve controlled resolidification of target portions of a thin film that are melted by laser beam irradiation. The thin film may be a metal or semiconductor material (e.g., silicon). The fluence of a set of laser beam pulses incident on the silicon thin film is modulated to control the extent of melting of a target portion of a silicon thin film. Then, between the incident laser beam pulses, the position of the target portion is shifted by slight physical translation of the subject silicon thin film to encourage epitaxial lateral solidification. This so-called lateral solidification process advantageously propagates the crystal structure of the initially molten target portion into grains of large size. The apparatus used for the processing includes an excimer laser, beam fluence modulators, beam focussing optics, patterning masks, and a motorized translation stage for moving the subject thin film between or during the laser beam irradiation. (See e.g., the '531 patent, FIG. 1, which is reproduced herein).

Consideration is now being given to ways of further improving laser annealing processes for semiconductor thin films, and in particular for recrystallization of thin films. Attention is directed towards apparatus and process techniques, with a view to both improve the annealing process, and to increase apparatus throughput for use, for example, in production of flat panel displays.

SUMMARY OF THE INVENTION

The present invention provides systems and methods for recrystallizing amorphous or polycrystalline semiconductor thin films to improve their crystalline quality and to thereby make them more suitable for device applications. The systems and processes are designed so that large surface area semiconductor thin films can be processed quickly.

Target areas of the semiconductor thin film may be intended for all or part semiconductor device structures. The target area may, for example, be intended for active regions of the semiconductor devices. The target areas are treated by laser beam irradiation to recrystallize them. The target areas are exposed to a laser beam having sufficient intensity or fluence to melt semiconductor material in the target areas. A one shot laser beam exposure may be used—the melted semiconductor material recrystallizes when the laser beam is turned off or moved away from the target area.

A large number of target areas in a region on the surface of the semiconductor thin film may be treated simultaneously by using laser radiation that is patterned. A projection mask can be deployed to suitably pattern the laser beam. The mask divides an incident laser beam into a number of beamlets that are incident on a corresponding number of target areas in a surface region of the semiconductor thin film. Each of the beamlets has sufficient fluence to melt the semiconductor material in target area on which it (beamlet) is incident. The dimensions of the beamlets may be chosen with consideration to the desired size of the target areas and the amount of semiconductor material that can be effectively recrystallized. Typical beamlet dimensions and corresponding target area dimensions may be of the order of the order of about 0.5 um to a few um.

An exemplary mask for patterning the laser beam radiation has a number of rectangular slits that are parallel to each other. Using this mask, an incident laser beam can be divided into a number of parallel beamlets. The target areas corresponding to these beamlets are distributed in the surface region in a similar parallel pattern. Another exemplary mask has a number of rectangular slits that are disposed in a rectangular pattern of sets of parallel and orthogonal slits. The slits may for example, be arranged in pairs along the sides of squares.

Using this mask the resultant radiation beamlets and the corresponding target areas also are distributed in a similar rectangular pattern (e.g., in sets of parallel and orthogonal target areas).

The laser beam may be scanned or stepped across the surface of the semiconductor thin film to successively treat all regions of the surface with a repeating pattern of target areas. Conversely, the semiconductor thin film can be moved relative to a laser beam of fixed orientation for the same purpose. In one embodiment of the invention, a motorized linear translation stage is used to move the semiconductor thin film relative to the laser beam in linear X-Y paths so that all surface regions of the semiconductor thin film can be exposed to the laser beam irradiation. The movement of the stage during the process can be continuous across a width of the semiconductor thin film or can be stepped from one region to the next. For some device applications, the target areas in one region may be contiguous to target areas in the next region so that extended strips of semiconductor material can be recrystallized. The recrystallization of contiguous target areas may benefit from sequential lateral solidification of the molten target areas. For other device applications, the target areas may be geometrically separate from target areas in the adjoining areas.

The generation of laser beam pulses for irradiation of the target areas may be synchronized with the movement of the linear translation stage so that the laser beam can be incident on designated target areas with geometric precision. The timing of the generated laser beam pulses may be indexed to the position of the translation stage, which supports the semiconductor thin film. The indexing may be occur in response to position sensors that indicate in real time the position of the stage, or may be based on computed co-ordinates of a geometrical grid overlaying the thin film semiconductor.

BRIEF DESCRIPTION OF THE DRAWINGS

Further features of the invention, its nature, and various advantages will be more apparent from the following detailed description of the preferred embodiments and the accompanying drawings, wherein like reference characters represent like elements throughout, and in which.

DETAILED DESCRIPTION OF THE PREFERRED EMBODIMENTS

Figure 1:
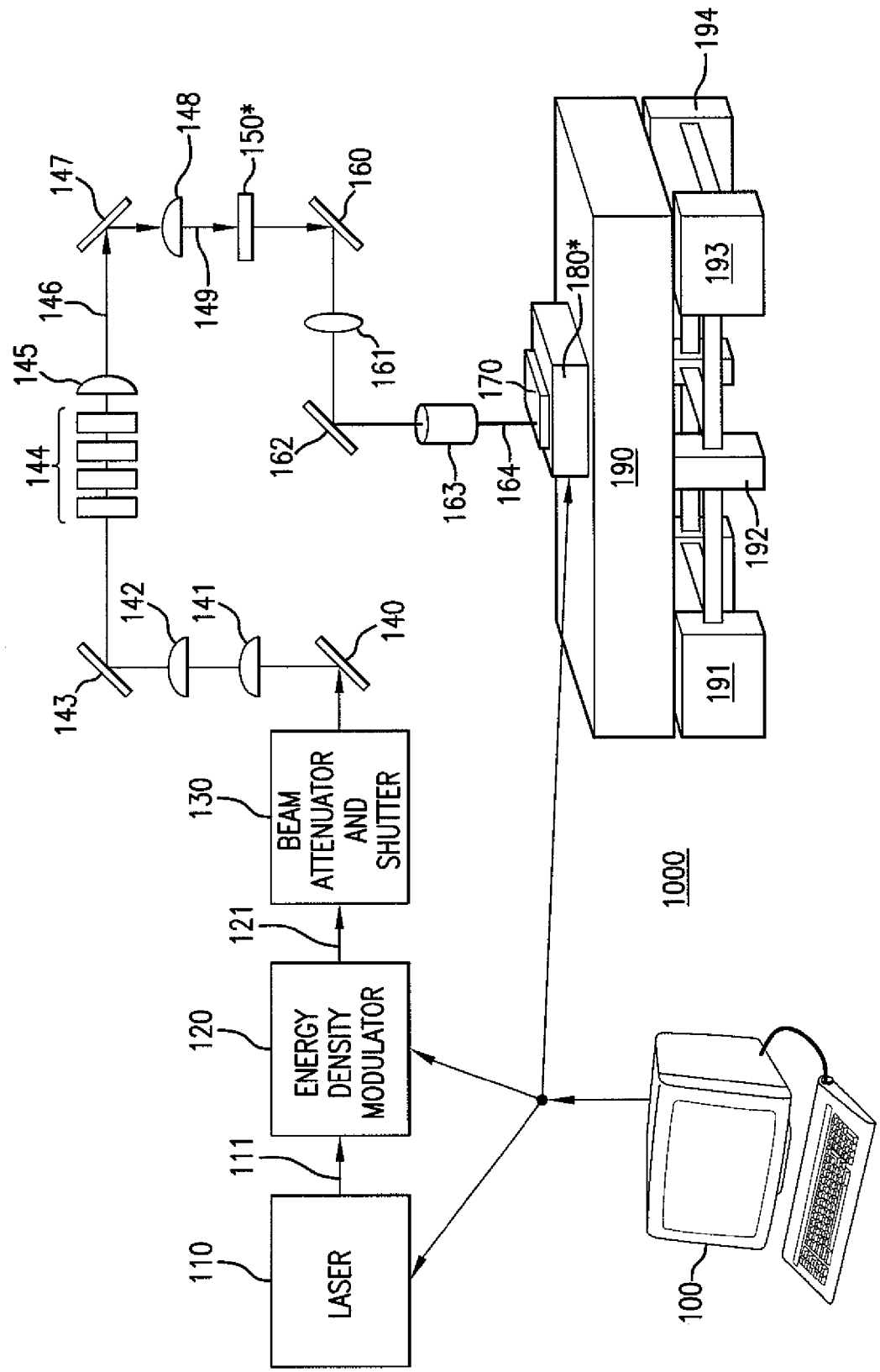
FIG. 1 is a schematic and block diagram of a semiconductor processing system for the laser annealing of semiconduct or thin films for recrystallization.

The present invention provides processes and systems for recrystallization of semiconductor thin films by laser annealing. The processes for recrystallization of semiconductor thin films involve one-shot irradiation of regions of a semiconductor thin film workpiece to a laser beam. The systems direct a laser beam to a region or spot on the surface of the semiconductor thin film. The incident laser beam has sufficient intensity or fluence to melt targeted portions of the region or spot of the semiconductor thin film on which the laser beam is incident. After the targeted incident areas or portions are melted, the laser beam is moved or stepped to another region or spot on the semiconductor thin film. The molten semiconductor material recrystallizes when the incident laser beam is moved away. The dwell time of the laser beam on a spot on the semiconductor thin film may be sufficient small so that the recrystallization of an entire semiconductor thin film workpiece can be carried out quickly with high throughput rates.

In order that the invention herein described can be fully understood the subsequent description is set forth in the context of laser annealing of silicon thin films. The annealed silicon thin films may be intended for exemplary TFT device applications. It will, however, be understood that the invention is equally applicable to other types of materials and/or other types of device applications.

An embodiment of the present invention is described herein with reference to FIGS. 1-6. Thin film silicon workpieces (see e.g., workpiece 170, FIGS. 2 and 4-6) are used herein as illustrative workpieces. Workpiece 170 may, for example, be a film of amorphous or randomly grained polycrystalline silicon deposited on a glass or plastic substrate for use in a flat panel display. The silicon film thickness may, for example, be in the range of about 100 Angstroms to greater than about 5000 Angstroms. Further, the present invention is described in the context of laser annealing apparatus 1000 shown in FIG. 1, which is disclosed in the '531 patent incorporated by reference herein. The processes of the present invention are described using this apparatus only for purposes of illustration, with the understanding that the principles of the present invention are applicable to any other irradiation apparatus or system that may be available.

Apparatus 1000 includes a radiation source 110 capable of generating an energetic radiation beam, suitable optical components 120-163 for shaping and directing the radiation beam to the surface of a work piece, and a motorized translation stage assembly 180 for supporting workpiece 170 during the processing. Radiation source 110 may be any suitable radiation source that is capable of generating continuous or pulsed beams of radiant energy of sufficient intensity to melt incident areas or portions of the semiconductor thin film of workpiece 170. Radiation source 110 may, for example, be any suitable solid state or other type of laser, an electron beam or ion beam source. For many semiconductor recrystallization applications, the radiation beam generated by radiation source 110 may have an intensity in the range of about 10 mJ/cm2 to 1 J/cm2 (e.g., 500 mJ/cm2). Suitable optics and/or electronics may be used to modulate or pulse the radiation beam generated by radiation source 110. A pulse duration (FWHM) in the range of about 10 to about 200 nsec, and a pulse repetition rate in the range of about 10 Hz to about 200 Hz may, for example, be suitable for laser annealing of silicon thin film workpieces 170. A suitable radiation source 110 for laser annealing of silicon thin film workpieces 170 may, for example, be a commercially available XeCl pulsed excimer laser (e.g., a Model LPX-315I excimer laser sold by Lambda Physik USA, Inc. of 3201 West Commercial Blvd. Ft. Lauderdale, Fla. 33309, USA).

Suitable optics 120-163 may be used to modulate, collimate or focus the radiation beam generated by laser 110 on to workpiece 170. In particular, an energy density modulator 120 may be used to time laser beam pulses and/or to modulate their fluence. Modulator 120 may, for example, be a commercially available controllable beam energy density modulator (e.g., a MicroLas® two-plate variable-attenuator also sold by Lambda Physik USA, Inc). Other optical components for shaping the laser beam (e.g., steering mirrors 140, 143, 147, 160 and 162, expanding and collimating lenses 141 and 142, homogenizer 144, condenser lens 145, a field lens 148, eye piece 161, controllable shutter 152, multi-element objective lens 163), also may, for example, be any suitable commercially available optical components sold by the by Lambda Physik USA, or by other vendors.

The suitable optical components 120-163 for shaping and directing the radiation beam may include a masking system 150. Masking system 150 may be a projection masking system, which is used for patterning incident radiation (149) so that radiation beam (164) that is ultimately incident on workpiece 170 is geometrically shaped or patterned.

Stage assembly 180, on which workpiece 170 rests during processing, may be any suitable motorized translation stage capable of movement in one or more dimensions. A translation stage capable of high translation speeds may be advantageous for the high throughput single-shot processing described herein. Stage assembly 180 may be supported on suitable support structures to isolate the thin film silicon workpiece 170 from vibrations. The support structures may, for example, include conventional optical benches such as a granite block optical bench 190 mounted on a vibration isolation and self-leveling system 191, 192, 193 and 194.

A computer 100 may be linked to laser 110, modulator 120, stage assembly 180 and other controllable components of apparatus 1000. Computer 100 may be used to control the timing and fluence of the incident laser beam pulses and the relative movement of the stage assembly 180. Computer 100 may be programmed to controllably move stage assembly translation stage 180 in X, Y and Z directions. Workpiece 170 may be moved, for example, over predetermined distances in the X-Y plane and as well as in the Z direction in response to instruction from computer 1000. In operation, the position of workpiece 170 relative to the incident radiation beam 164 may be continuously adjusted or intermittently reset during the single-shot laser annealing process at suitable times according to preprogrammed process recipes for single shot recrystallization of workpiece 170. The movement of workpiece 170 may be synchronized or co-ordinated with the timing of radiation beam pulses generated by laser 100.

In apparatus 1000, the movement of stage assembly 180 translates the workpiece 170 and the radiation beam (164) relative to each other. In the processing described herein the radiation beam (164) is held fixed in a position or orientation while stage 180 is moved. Alternative configurations or arrangements of optical components may be used to move incident radiation beam 164 and workpiece 170 relative to each other along defined paths. For example, a computer-controlled beam steering minor may be used to deflect radiation beam 164 while stage 180 is held fixed in position. By such beam deflecting arrangements it may be possible to completely or partially dispense with the use of mechanical projection masks (e.g., masking system 150) and instead use electronic or optical beam guiding mechanisms to scan or step selected portions of workpiece 170 at a rapid pace.

Using apparatus 1000, sequential lateral solidification of molten semiconductor material may be achieved using, for example, the processes that involve incremental movement or shifting the position of stage 180 between excimer laser pulses as described in the '531 patent. The movements of stage 170 are small, so that the portions of the silicon thin film that are molten by sequential pulses are proximate to each other. The proximity of the two molten portions allows the first portion to recrystallize and propagate its crystal structure into the adjacent portion, which is melted by the next pulse.

Figure 2:
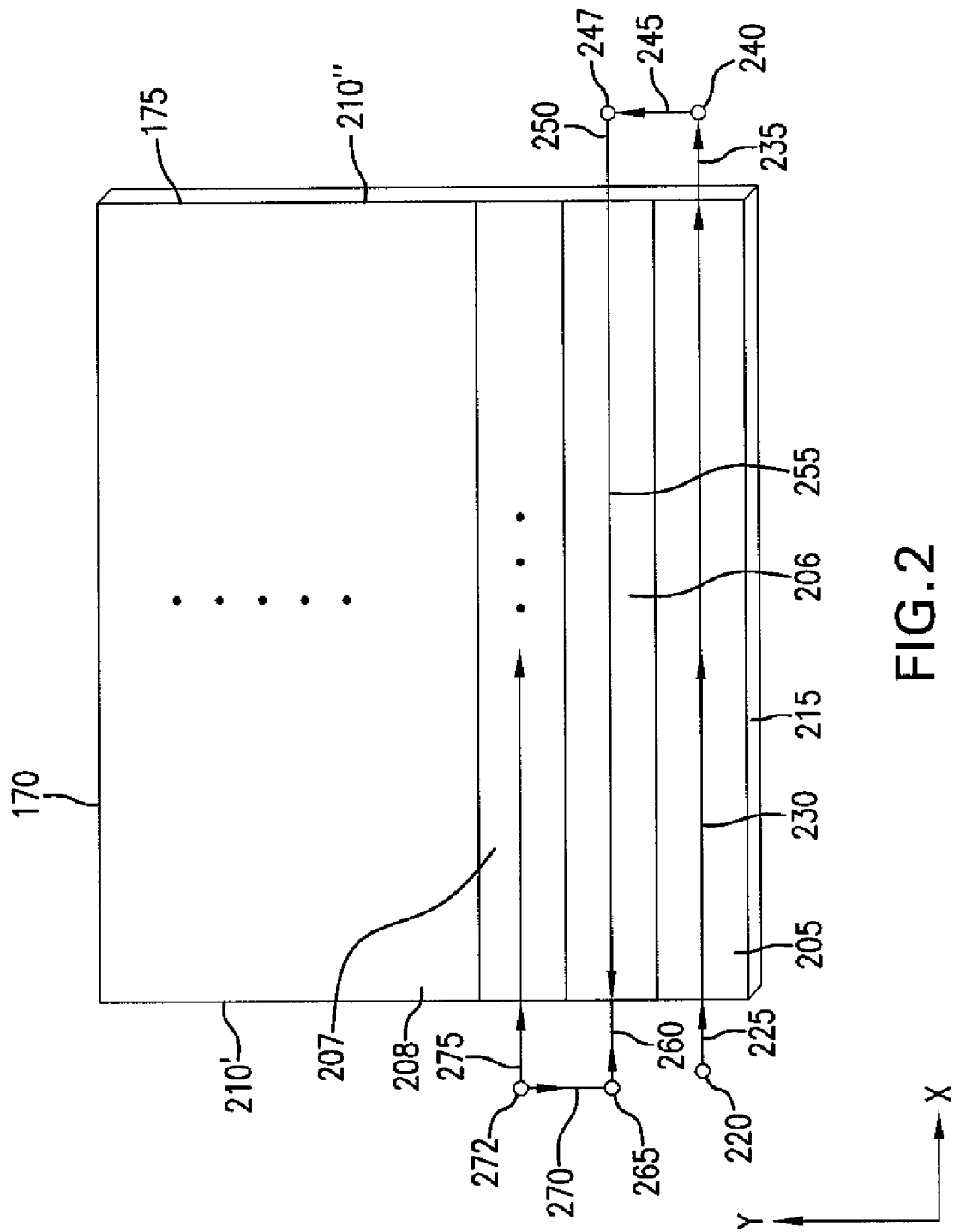
FIG. 2 is a top exploded view of an exemplary thin film silicon workpiece.

In the single shot recrystallization processes described here, apparatus 1000 may be used to scan or step a laser beam across the surface of a semiconductor thin film by moving of stage assembly 180. The laser beam has sufficient intensity or fluence to melt target areas in the regions or spots at which the laser beam pulses are incident. To process an entire workpiece 170, stage assembly 180 may be moved predetermined distances to cause the laser beam to move along paths across semiconductor thin film 175/workpiece 170. FIG. 2 also schematically shows paths 230, 255 etc. that may be traced by incident radiation beam 164 as it is moved across the surface of the workpiece 170.

The number of paths and their geometrical orientation may be determined by the cross sectional dimensions of the laser beam and the target area requirements of the circuit or device applications for which workpiece 170 is being processed. Accordingly, the surface of a semiconductor thin film 175/workpiece 170 may be partitioned in a geometric array of regions for generating processing recipes for computer 1000 or otherwise controlling the operation of apparatus 1000. FIG. 2 shows an exemplary geometrical partitioning of the surface of a semiconductor thin film 175 on workpiece 170. In the exemplary geometrical partitioning shown in FIG. 2, the surface is divided into a number of rows (e.g., 205, 206, 207, etc.) each having a width W. The widths of rows W may be selected with consideration to the cross sectional width of incident radiation beam 164. Each row contains one or more regions. As an illustrative numerical example, workpiece 170 may have x and y dimensions of about 30 cms and 40 cms, respectively. Each of rows 205, 206, 207, . . . etc., may, for example, have a width W of about Y2 cm in the Y direction. This value of W may, for example, correspond a laser beam width of about the same size. Thus, the surface of workpiece 170 can be divided into eighty (80) rows each with a length of about 30 cms in the X direction. Each row contains one or more regions whose combined length equals 30 cms (not shown).

The co-ordinates of each row may be stored in computer 100 for use by the processing recipes. Computer 1000 may use the stored co-ordinates, for example, to compute the direction, timing and travel distances of stage 180 during the processing. The co-ordinates also may be used, for example, to time the firing of laser 110 so that designated regions of semiconductor thin film 175 are irradiated as stage 180 is moved.

Workpiece 170 may be translated in linear directions while silicon thin film 175 is being irradiated so that a linear strip of silicon thin film 175 is exposed to radiation beams of melting intensity or fluence. The translation paths traced by the radiation beams may be configured so that the desired portions of the entire surface of thin film silicon 175 are successively treated by exposure to laser beams. The translation paths may be configured, for example, so that the laser beam traverses rows 205, 206, 207, etc. sequentially. In FIG. 2, the radiation beam is initially directed to a point 220 off side 210' near the left end of row 205. Path 230 represents, for example, the translation path traced by the center of the radiation beam through row 205 as stage 180 is moved in the negative X direction.

The movement of stage 180 may be conducted in a series of steps in an intermittent stop-and-go fashion, or continuously without pause until the center of the radiation beam is directed to a point 240 near the right end of row 205. Path segments 225 and 235 represent extensions of path 230 that may extend beyond edges 210' and 210" of workpiece 170 to points 220 and 240, respectively. These segments may be necessary to accommodate acceleration and deceleration of stage assembly 180 at the ends of path 230 and/or may be useful for reinitializing stage 180 position for moving stage 180 in another direction. Stage 180 may, for example, be moved in the negative Y direction from point 240, so that the center of the radiation beam traces path 245 to point 247 next to the right end of row 206 in preparation for treating the silicon material in row 206. From point 247 in manner similar to the movement along path 230 in row 205 (but in the opposite direction), stage 180 is moved in the X direction so that the center of the radiation beam moves along path 255 irradiating thin film silicon material in row 206. The movement may be continued till the center of radiation beam is incident at spot 265 that is near the left end of row 206. Path extensions 260 and 250 represent segments of path 255 that may extend beyond edges 210' and 210" to spots 247 and 265, respectively. Further linear movement of stage 180 in the Y direction moves the center of the incident radiation beam along path 270 to a point 272 next to row 207. Then, the thin film silicon material in row 207 may be processed by moving stage 180 in the negative X direction along path 275 and further toward the opposite side 210"of workpiece 170. By continuing X and Y direction movements of stage 180 in the manner described for rows 205, 206, and 207, all of the rows on the surface of thin film silicon 175 may be treated or irradiated. It will be understood that the particular directions or sequence of paths described above are used only for purposes of illustration, other directions or sequences may be used as appropriate.

In an operation of apparatus 1000, silicon thin film 175 may be irradiated by beam pulse 164 whose geometrical profile is defined by masking system 150. Masking system 150 may include suitable projection masks for this purpose. Masking system 150 may cause a single incident radiation beam (e.g., beam 149) incident on it to dissemble into a plurality of beamlets in a geometrical pattern. The beamlets irradiate a corresponding geometrical pattern of target areas in a region on the thin film silicon workpiece. The intensity of each of the beamlets may be chosen to be sufficient to induce complete melting of irradiated thin film silicon portions throughout their (film) thickness.

The projection masks may be made of suitable materials that block passage of radiation through undesired cross sectional areas of beam 149 but allow passage through desired areas. An exemplary projection mask may have a blocking/unblocking pattern of rectangular stripes or other suitable geometrical shapes which may be arranged in random or in geometrical patterns. The stripes may, for example, be placed in a parallel pattern as shown in FIG. 3a, or in a mixed parallel and orthogonal pattern as shown in FIG. 3b, or any other suitable pattern.

Figure 3A:
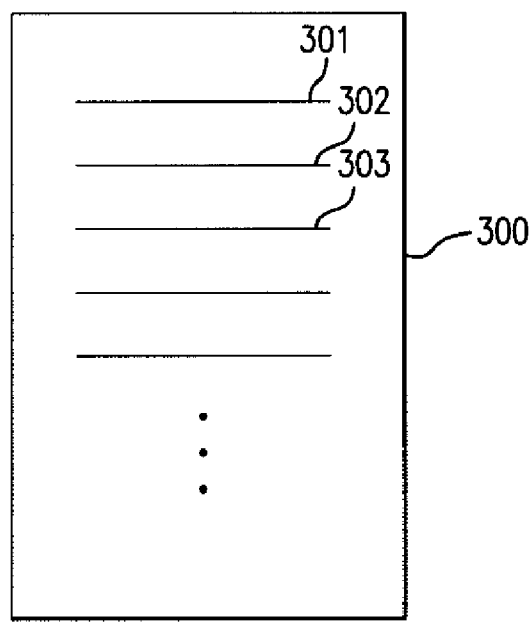
FIGS. 3a and 3b are top views of exemplary masks in accordance with the principles of present invention.

With reference to FIG. 3a, exemplary mask 300A includes beam-blocking portions 310 which has a number of open or transparent slits 301, 302, 303, etc. Beam-blocking portions 310 prevent passage of incident portions of incident beam 149 through mask 300A. In contrast, open or transparent slits 301, 302, 303, etc. permit passage of incident portions of radiation beam 149 through mask 300. Accordingly, radiation beam 164 exiting mask 300A has a cross section with a geometrical pattern corresponding to the parallel pattern of the plurality of open or transparent slits 301, 302, 303, etc. Thus when positioned in masking system 150, mask 300A may be used to pattern radiation beam 164 that is incident on semiconductor thin film 175 as a collection of parallel rectangular-shaped beamlets. The beamlets irradiate a corresponding pattern of rectangular target areas in a region on the surface of the on semiconductor thin film 175. The beamlet dimensions may be selected with a view to promote recrystallization or lateral solidification of thin film silicon areas melted by a beamlet. For example, a side length of a beamlet may be chosen so that corresponding target areas in adjoining regions are contiguous. The size of the beamlets and the inter beamlet separation distances may be selected by suitable choice of the size and separation of transparent slits 301, 302, 303, etc. Open or transparent slits 301, 302, 303, etc. having linear dimensions of the order of a micron or larger may, for example, generate laser radiation beamlets having dimensions that are suitable for recrystallization processing of silicon thin films in many instances.

Figure 3B:
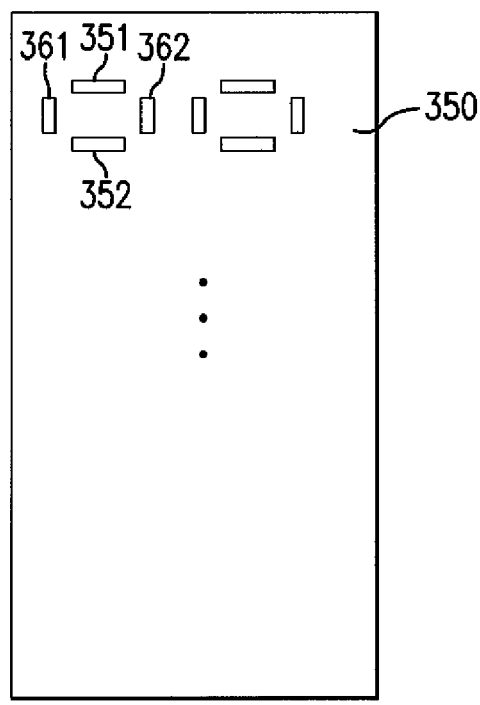

FIG. 3b shows another exemplary mask 300B with a pattern which is different than that of mask 300A. In mask 300B, a number of open or transparent slits 351, 352, 361, 362 etc. may, for example, be arranged in pairs along the sides of squares. This mask 300B also may be used in masking system 150 to pattern the radiation beam 164 that is incident on semiconductor thin film 175. The radiation beam 164 may be patterned, for example, as a collection of beamlets arranged in square-shaped patterns. The beamlet dimensions may be selected with a view to promote recrystallization or lateral solidification of thin film silicon areas melted by a beamlet. Open or transparent slits 351, 352, 361, 362, etc. having linear dimensions of about 0.5 micron may generate laser radiation beamlets of suitable dimensions for recrystallization of thin film silicon areas It will be understood that the specific mask patterns shown in FIGS. 3a and 3b are exemplary. Any other suitable mask patterns may be used including, for example, the chevron shaped patterns described in the '625 patent. A particular mask pattern may be chosen in consideration of the desired placement of TFTs or other circuit or device elements in the semiconductor product for which the recrystallized thin film silicon material is intended.

Figure 4:
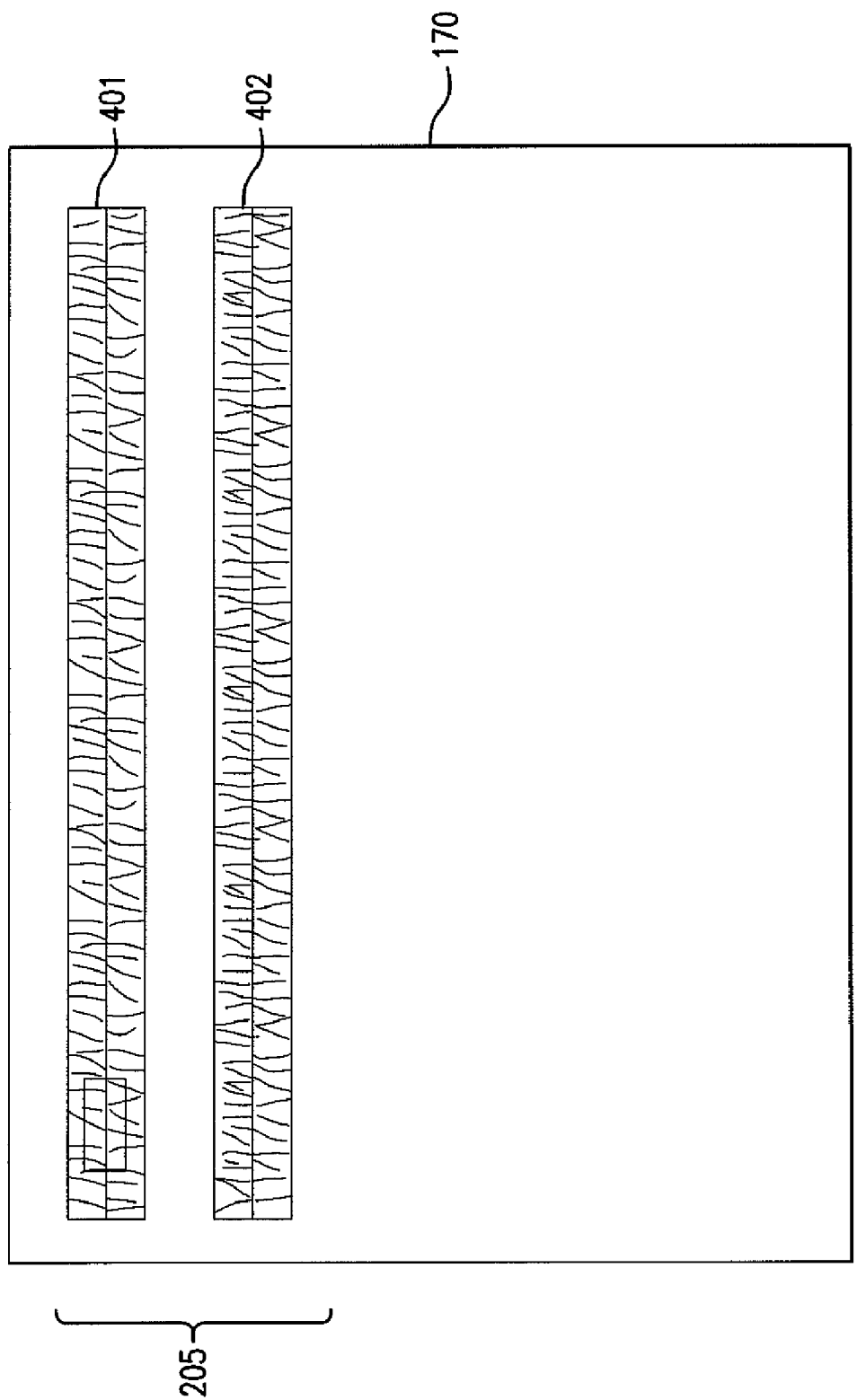
FIG. 4 is a schematic diagram illustrating a portion of the thin film silicon workpiece of FIG. 2 that has been processed using the mask of FIG. 3a, in accordance with the principles present invention.
Figure 5:
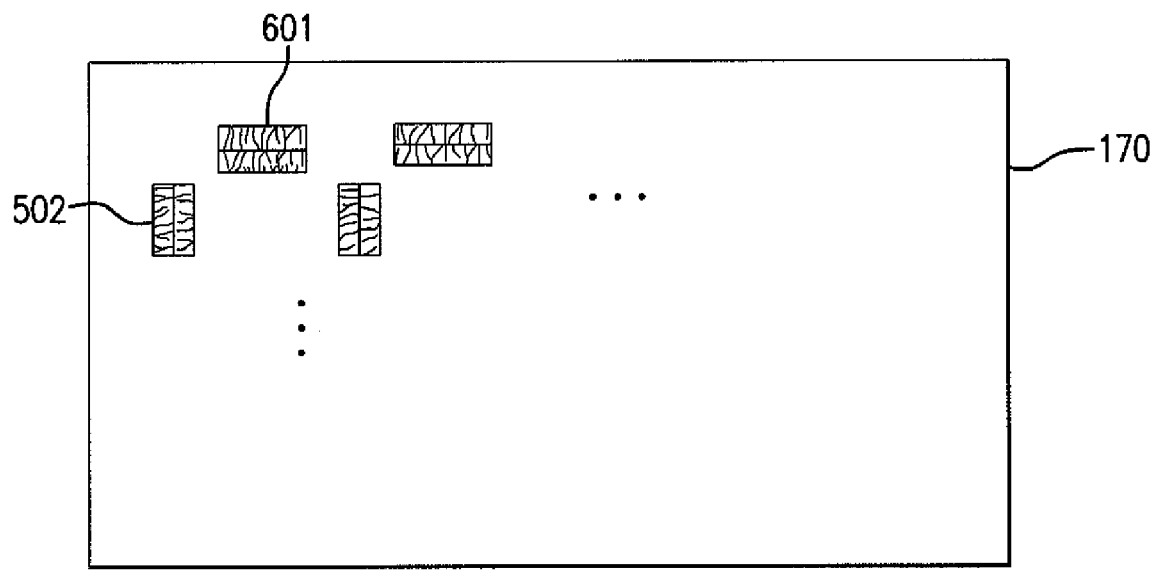
FIG. 5 is a schematic diagram illustrating an exemplary processed thin film silicon workpiece that has been processed using the mask of FIG. 3b in accordance with the principles present invention.

FIG. 4 shows, for example, portions of workpiece 170 that has been processed using mask 300A of FIG. 3a. (Mask 300A may be rotated by about 90 degrees from the orientation shown in FIG. 3a). The portion shown corresponds to a row, for example, row 205 of workpiece 170 (FIG. 2). Row 205 of processed workpiece 170 includes recrystallized polycrystalline silicon linear regions or strips 401, 402, etc. Each of the linear strips is a result of irradiation by a radiation beamlet formed by a corresponding mask slit 301, 302, etc. The continuous extent of recrystallized silicon in the linear strips across row 205 may be a consequence, for example, of a continuous movement of the stage 180 along path 230 under laser beam exposure (FIG. 2). Strips 401, 402, may have a microstructure corresponding to the one shot exposure with colliding liquid/solid growth fronts in the center creating a long location-controlled grain boundary. Alternatively, in a directional solidification process the continuous extent may be a result of closely spaced stepped movements of stage 180 along path 230 that are sufficiently overlapping to permit formation of a continuous recrystallized silicon strip. In this alternative process, the microstructure of the recrystallized material may have long grains parallel to the scanning direction. The recrystallized polycrystalline silicon (e.g. strips 401, 402, etc.) may have a generally uniform structure, which may be suitable for placement of the active region of one or more TFT devices. Similarly, FIG. 5 shows, exemplary results using mask 300B of FIG. 3b. Exemplary processed workpiece 170 includes recrystallized polycrystalline silicon strips 501, 502, etc. Recrystallized polycrystalline silicon strips 501, 502, etc. like strips 401 and 402 may have a uniform crystalline structure, which is suitable for placement of the active regions of TFT devices. Strips 501 and 502 that are shown to be generally at right angles to each other may correspond to radiation beamlets formed by orthogonal mask slits (e.g., FIG. 3b slits 351, 361). The distinct geometrical orientation and physical separation of strips 501 and 502 (in contrast to extended length of strips 401 and 402) may be a consequence, for example, of physically separated exposure to laser radiation during the processing of workpiece 170. The separated radiation exposure may be achieved by stepped movement of stage 180 (e.g., along path 230 FIG. 2) during the processing. Additionally or alternatively, the separated exposure may be achieved by triggering laser 110 to generate radiation pulses at appropriate times and positions of stage 180 along path 230 while stage 180 and laser beam 164 are moved or scanned relative to each other at constant speeds.

Figure 6:
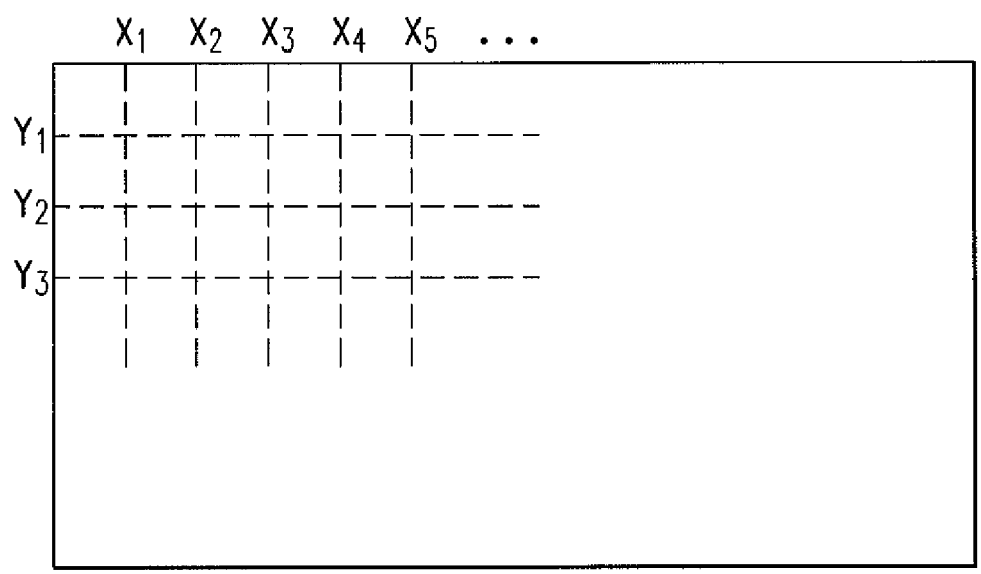
FIG. 6 is a schematic diagram illustrating an exemplary geometrical pattern whose co-ordinates are used to trigger radiation pulses incident on a silicon thin film workpiece in accordance with the principles present invention.

Computer 100 may be used control the triggering of laser 110 at appropriate times and positions during the movement of stage 180. Computer 100 may act according to preprogrammed processing recipes that, for example, include geometrical design information for a workpiece-in-process. FIG. 6 shows an exemplary design pattern 600 that may be used by computer 1000 to trigger laser 110 at appropriate times. Pattern 600 may be a geometrical grid covering thin film silicon 175/workpiece 170. The grid may, for example, be a rectangular x-y grid having coordinates (x1, x2, . . . etc.) and (y1, y2, . . . etc.). The grid spacings may be regular or irregular by design. Pattern 600 may be laid out as physical fiducial marks (e.g., on the thin film silicon workpiece) or may be a mathematical construct in the processing recipes. Computer 100 may trigger laser 110 when stage 180 is at the grid coordinates (xi, yi). Computer 100 may do so in response, for example, to conventional position sensors or indicators, which may be deployed to sense the position of stage 180. Alternatively, computer 100 may trigger laser 110 at computed times, which are computed from parameters such as an initial stage position, and the speeds and direction of stage movements from the initial stage position. Computer 100 also may be used advantageously to instruct laser 110 to emit radiation pulses at a variable rate, rather than at a usual even rate. The variable rate of pulse generation may be used beneficially to accommodate changes in the speed of stage 180, for example, as it accelerates or decelerates at the ends of paths 230 and the like.

It will be understood that the foregoing is only illustrative of the principles of the invention and that various modifications can be made by those skilled in the art without departing from the scope and spirit of the invention, which is limited only by the claims that follow.

The invention claimed is:

1. A method for forming an electronic device on a semiconductor thin film, comprising:
   (a) providing the semiconductor thin film having a surface;
   (b) patterning a radiation beam into at least one beamlet in a pattern of beamlets, wherein each beamlet is incident on a target area of a first region of the semiconductor thin film;
   (c) irradiating the first region of the semiconductor thin film with a pulse of the patterned radiation beam, wherein each beamlet of the patterned radiation beam has sufficient fluence to melt semiconductor material in the target area on which it is incident, and wherein the molten semiconductor material in the target area recrystallizes when it is no longer exposed to the incident beamlet;
   (d) continuously translating the semiconductor thin film relative to the patterned radiation beam such that a second region of the surface of the semiconductor thin film is irradiated in the same manner as in (c), wherein the second region corresponds to a second area which is separate from a first area corresponding to the first region; and
   (e) forming the electronic device on at least the target area.

2. The method of claim 1, further comprising the step of using a mask to pattern the beamlets from the radiation beam pulse.

3. The method of claim 2, wherein the mask comprises:
   a blocking portion that blocks through passage of radiation incident on it; and
   a plurality of slits in a pattern, wherein the slits allow through passage of radiation incident on them, and wherein the slits are disposed substantially parallel to each other in the pattern.

4. The method of claim 2, wherein the mask comprises:
   a blocking portion that blocks through passage of radiation incident on it; and
   a plurality of slits in a pattern, wherein the slits allow through passage of radiation incident on them, and wherein the slits are arranged in pairs along the sides of rectangles in the pattern.

5. The method of claim 1, further the step of comprising supporting the semiconductor thin film on a movable stage, and wherein translating the semiconductor thin film relative to the radiation beam comprises moving the movable stage along a linear path to the next region.

6. The method of claim 5, wherein the semiconductor thin film comprises rows of regions, further comprising moving the movable stage along the linear path through a first row of regions on the surface of the semiconductor thin film.

7. The method of claim 6, wherein the movable stage is moved continuously without pause through the row of regions.

8. The method of claim 6, wherein the movable stage is paused at a region and is then stepped to an adjacent region.

9. The method of claim 6, further comprising moving the movable stage along linear paths through successive rows of regions until the entire surface of the semiconductor thin film has been processed.

10. The method of claim 1, wherein at least one of the target areas in the first region is contiguous to a corresponding target area in the next region, so that after irradiation of the first and next regions an extended strip or recrystallized semiconductor material is formed.

11. The method of claim 1, further comprising using a laser to generate a pulse of a radiation beam.

12. The method of claim 11, wherein the laser is triggered to generate the pulse of the radiation beam according to a position of the thin film semiconductor region relative to the radiation beam.

13. The method of claim 11, further comprising supporting the semiconductor thin film on a movable stage, and wherein translating the semiconductor thin film relative to the radiation beam comprises moving the movable stage, and wherein the laser is triggered to generate the pulse of the radiation beam according to a position of the movable stage.

14. The method of claim 13, wherein the position of the movable stage is sensed by position sensors.

15. The method of claim 13, wherein the position of the movable stage is computed from an initial position of the stage.

16. The method of claim 1, wherein forming the electronic device comprises forming a thin-film transistor device.

17. The method of claim 1, wherein forming the electronic device on at least the target area comprises forming an active channel region of a thin-film transistor device on the target area.

18. The method of claim 17, wherein forming the electronic device further comprises forming at least a gate electrode, a drain electrode, and a source electrode adjacent to the active channel region.

19. The method of claim 1, wherein patterning the radiation beam further comprises homogenizing the radiation beam.

20. The method of claim 1, wherein each beamlet of the patterned radiation beam has sufficient fluence to melt semiconductor material in the target area throughout its thickness.

21. The method of claim 1, wherein each beamlet of the patterned radiation beam has sufficient fluence to melt semiconductor material in the target area such that the molten semiconductor material in the target area recrystallizes substantially through lateral crystallization.

22. The method of claim 21, wherein forming the electronic device on at least the target area comprises forming an active channel region of a thin-film transistor device entirely on the laterally crystallized target area.

23. The method of claim 22, wherein the laterally crystallized target area is free from grain boundaries perpendicular to a direction of current of the active region.

* * * * *